US012772547B2

(12) United States Patent
Davis et al.

(10) Patent No.: US 12,772,547 B2
(45) Date of Patent: Oct. 20, 2026

(54) FORMING METAL GATE CUTS USING MULTIPLE PASSES FOR DEPTH CONTROL

(71) Applicant: Intel Corporation, Santa Clara, CA (US)

(72) Inventors: Alison V. Davis, Portland, OR (US); Bern Youngblood, Hillsboro, OR (US); Reza Bayati, Portland, OR (US); Swapnadip Ghosh, Hillsboro, OR (US); Matthew J. Prince, Portland, OR (US); Jeffrey Miles Tan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 17/937,212

(22) Filed: Sep. 30, 2022

(65) Prior Publication Data

US 2024/0113105 A1 Apr. 4, 2024

(51) Int. Cl.
*H01L 27/088* (2006.01)
*H01L 21/762* (2006.01)
(Continued)

(52) U.S. Cl.
CPC ......... *H10D 84/83* (2025.01); *H10D 30/6735* (2025.01); *H10D 30/6757* (2025.01);
(Continued)

(58) Field of Classification Search
CPC ............... H10D 84/83; H10D 30/6735; H10D 30/6757; H10D 62/121; H10D 30/43; H10D 30/014; H10D 62/364; H10D 84/0151; H10D 84/0135; H10D 84/038; H10D 84/0158; H10D 84/834; H10D 30/024;
(Continued)

(56) References Cited

U.S. PATENT DOCUMENTS

2019/0067417 A1* 2/2019 Ching .................. H10D 84/834
2019/0067446 A1 2/2019 Ching et al.
(Continued)

FOREIGN PATENT DOCUMENTS

CN 114975435 A 8/2022

OTHER PUBLICATIONS

Extended European Search Report received for EP Application No. 23191474.8, dated Jan. 23, 2024. 8 pages.

*Primary Examiner* — Tong-Ho Kim
(74) *Attorney, Agent, or Firm* — Schwabe, Williamson & Wyatt, P.C.

(57) ABSTRACT

Techniques are provided herein to form semiconductor devices that include gate cuts with different widths (e.g., at least a 1.5× difference in width) but substantially the same height (e.g., less than 5 nm difference in height). A given gate structure extending over one or more semiconductor regions may be interrupted with any number of gate cuts that each extend through an entire thickness of the gate structure. According to some embodiments, gate cuts of a similar first width are formed via a first etching process while gate cuts of a similar second width that is greater than the first width are formed via a second etching process that is different from the first etching process. Using different etch processes for gate cuts of different widths maintains a similar height for the gate cuts of different widths.

20 Claims, 11 Drawing Sheets

(51) Int. Cl.

| | |
|---|---|
| ***H01L 23/522*** | (2006.01) |
| ***H01L 29/06*** | (2006.01) |
| ***H01L 29/423*** | (2006.01) |
| ***H01L 29/786*** | (2006.01) |
| ***H10D 30/67*** | (2025.01) |
| ***H10D 62/10*** | (2025.01) |
| ***H10D 84/83*** | (2025.01) |
| ***H10W 10/00*** | (2026.01) |
| ***H10W 10/17*** | (2026.01) |
| ***H10W 20/42*** | (2026.01) |

(52) U.S. Cl.
CPC ...... *H10D 62/121* (2025.01); *H10W 10/0143* (2026.01); *H10W 10/17* (2026.01); *H10W 20/42* (2026.01)

(58) Field of Classification Search
CPC .................. H10D 64/512; H10D 30/62; H01L 21/76229; H01L 23/5226; B82Y 10/00; H05K 1/18
USPC .......................................................... 257/401
See application file for complete search history.

(56) References Cited

U.S. PATENT DOCUMENTS

| | | | | |
|---|---|---|---|---|
| 2020/0043945 | A1 | 2/2020 | Kim et al. | |
| 2022/0085011 | A1 | 3/2022 | Lee et al. | |
| 2022/0157722 | A1 * | 5/2022 | Bouche | H01L 23/5226 |
| 2022/0254776 | A1 * | 8/2022 | Cheng | H10D 62/121 |
| 2022/0310514 | A1 | 9/2022 | Wei | |
| 2022/0352150 | A1 * | 11/2022 | Chiang | H10D 64/017 |
| 2024/0105800 | A1 * | 3/2024 | Bayati | H10D 84/038 |

* cited by examiner

FORMING METAL GATE CUTS USING MULTIPLE PASSES FOR DEPTH CONTROL

FIELD OF THE DISCLOSURE

The present disclosure relates to integrated circuits, and more particularly, to metal gate cuts made in semiconductor devices.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the formation of certain device structures used to isolate adjacent transistors becomes challenging. Accordingly, there remain a number of non-trivial challenges with respect to forming semiconductor devices.

Figure 1A:
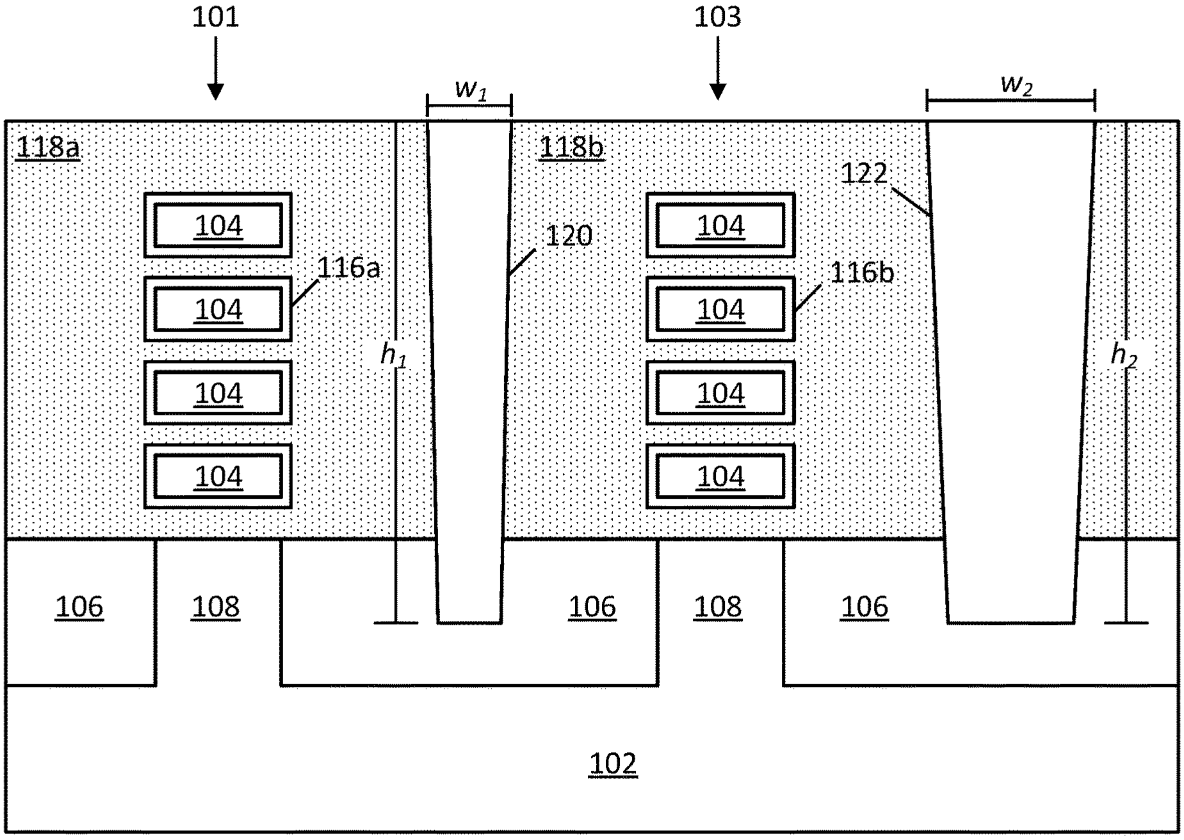
FIGS. 1A and 1B are cross-sectional and plan views, respectively, of some semiconductor devices that illustrate differently sized gate cuts having similar heights, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that include gate cuts with different widths (e.g., 1.5× difference in width, or higher) but substantially the same height (e.g., less than 5 nm difference in height). The techniques can be used in any number of integrated circuit applications and are particularly useful with respect to device layer transistors, such as finFETs or gate-all-around transistors (e.g., ribbonFETs and nanowire FETs). In an example, one or more semiconductor devices include a gate structure around or otherwise on a semiconductor region of the one or more semiconductor devices. The semiconductor region can be, for example, a fin of semiconductor material that extends from a source region to a drain region, or one or more nanowires or nanoribbons of semiconductor material that extend from a source region to a drain region. The gate structure includes a gate dielectric (e.g., high-k gate dielectric material) and a gate electrode (e.g., conductive material such as workfunction material and/or gate fill metal). The gate structure may be interrupted with any number of gate cuts that each extend through an entire thickness of the gate structure. Each gate cut includes a dielectric material to electrically isolate the portions of the gate structure on either side of the gate cut. Some gate cuts may be wider than other gate cuts. According to some embodiments, gate cuts of a similar first width are formed via a first etching process while gate cuts of a similar second width that is greater than the first width are formed via a second etching process that is different from the first etching process. The wider gate cuts may also be formed before the narrower gate cuts, in some examples. Using different etch processes for gate cuts of different widths maintains a similar height for the gate cuts of different widths. Numerous variations and embodiments will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. Example structures like gate cuts are used in integrated circuit design to isolate gate structures from one another. One possible way to form gate cuts is to use a gate patterning scheme that uses the poly-cut flow, where the gate cut is formed prior to formation of the final metal gate. Another approach might be to use a gate patterning scheme that uses the metal gate cut flow. Such approaches generally etch a trench or other recess through a thickness of the poly or metal gate structure and fill the trench with a dielectric material. Gate cuts formed after the formation of the metal gate structures may have some benefits over gate cuts formed during poly-cut flow. However, not all gate cuts may have the same CD, and those gate cuts having a higher CD (e.g., a greater width) will extend deeper compared to gate cuts having a smaller CD due to loading effects that occur during the etching process. Gate cuts that extend too deep can disrupt the formation of backside structures and generally interfere with various backside processes.

Thus, and in accordance with an embodiment of the present disclosure, techniques are provided herein to form gate cuts having different widths but substantially the same height. First one or more gate cuts may have height-to-width aspect ratios of 5:1 or higher, such as 9:1, 10:1, or 11:1, while second one or more gate cuts may be wider, but with substantially the same height, with height-to-width aspect ratios of 3:1 or higher, such as 4:1 or 5:1. According to some embodiments, a first plasma-based etching process is performed to form first trenches through the gate structure for the first one or more gate cuts and the first trenches are filled with dielectric material to form the first one or more gate cuts. Then, a second plasma-based etching process is performed to form second trenches through the gate structure for the second one or more gate cuts and the second trenches are filled with dielectric material to form the second one or more gate cuts. Using different etching processes for gate cuts having different widths (e.g., at least 1.5× or at least 2× difference in width) allows for the time of each etch process to be different. For example, the second etch process used to form the gate cuts having a greater width can be made to have a shorter duration than the first etch process used to form the gate cuts having the smaller width since the wider trenches will etch deeper more quickly compared to the narrower trenches. Accordingly, the depths of both the wide trenches and the narrow trenches for the gate cuts of different widths can be about the same (e.g., within 20 nm of each other, within 10 nm of each other, or within 5 nm of each other).

According to an embodiment, an integrated circuit includes one or more semiconductor regions extending in a first direction between corresponding source regions and drain regions, a gate structure extending in a second direction over the one or more semiconductor regions, a first gate cut comprising a first dielectric material and extending in a third direction through an entire thickness of the gate structure, and a second gate cut comprising a second dielectric material and extending in the third direction through the entire thickness of the gate structure. A width at the top of the second gate cut is at least twice as large as a width at the top of the first gate cut. The first gate cut and the second gate cut each has a height in the third direction that differs by no more than 10% or 20%, depending on the overall height. In some such examples, for instance, the first gate cut and the second gate cut each has a height in the third direction that is within 1 to 4 nm of a target height (e.g., each of the first gate cut and the second gate has a height in the third direction or 130 nm+/−4 nm, or +/−2 nm, or +/−1 nm).

According to an embodiment, an integrated circuit includes a first semiconductor region extending in a first direction between corresponding source and drain regions, a second semiconductor region extending in the first direction between corresponding source and drain regions, a gate structure extending in a second direction over at least the first semiconductor region and the second semiconductor region, a first gate cut comprising a first dielectric material and extending in a third direction through an entire thickness of the gate structure, and a second gate cut comprising a second dielectric material and extending in the third direction through the entire thickness of the gate structure. The first gate cut is adjacent to a first side of the first semiconductor region and is spaced in the second direction from the first side of the first semiconductor region by a first distance. The second gate cut is adjacent to the corresponding first side of the second semiconductor region and is spaced in the second direction from the corresponding first side of the second semiconductor region by a second distance. The second distance differs by a least 4 nm from the first distance.

According to another embodiment, a method of forming an integrated circuit includes forming one or more fins comprising semiconductor material, the one or more fins extending above a substrate and the semiconductor material extending in a first direction; forming a gate layer extending over the semiconductor material in a second direction different from the first direction; exposing a first plurality of gate layer regions using a first masking layer; forming a first plurality of gate cuts at the first plurality of gate layer regions, the first plurality of gate cuts extending in a third direction through an entire thickness of the gate layer; exposing a second plurality of gate layer regions using a second masking layer; and forming a second plurality of gate cuts at the second plurality of gate layer regions, the second plurality of gate cuts extending in the third direction through the entire thickness of the gate layer. The second plurality of gate cuts have a topside width that is at least twice as large as a topside width of the first plurality of gate cuts.

The techniques can be used with any type of non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of gate cuts having different widths (e.g., 1.5× or more, such as at least 2× difference in width) but substantially the same height (e.g., within 10 nm of each other, within 5 nm of each other, within 4 nm of each other, or within 2 nm of each other, or within 10% of a target height, or within 5% of a target height, or within 2% of a target height). In some embodiments, such tools may be used to determine that a lateral distance between gate cuts having a first width and an adjacent semiconductor region is different (e.g., by at least 4 nm) than a lateral distance between gate cuts having a second width and a corresponding adjacent semiconductor region. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
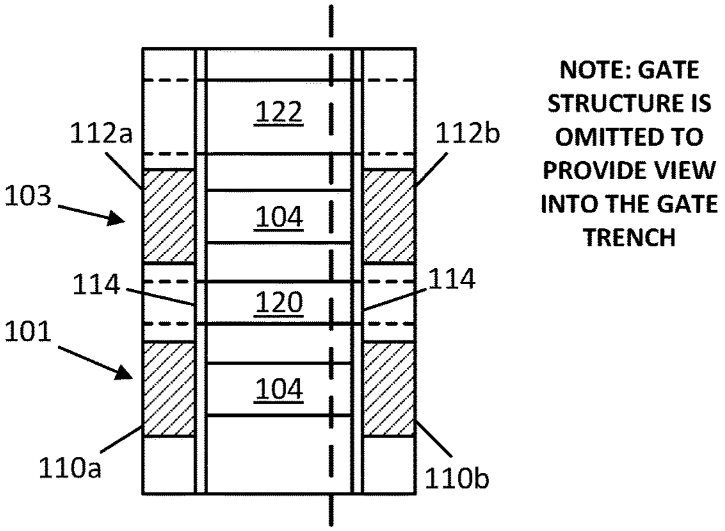

FIG. 1A is a cross sectional view taken across two example semiconductor devices 101 and 103, according to an embodiment of the present disclosure. FIG. 1B is a top-down view of the adjacent semiconductor devices 101 and 103 where FIG. 1A illustrates the cross section taken across the vertical dashed line. It should be noted that some of the material layers (such as gate electrode 118*a* and 118*b*) in the top-down view of FIG. 1B have been omitted for clarity. Each of semiconductor devices 101 and 103 may be non-planar metal oxide semiconductor (MOS) transistors, such as tri-gate (e.g., finFET) or gate-all-around (GAA) transistors, although other transistor topologies and types could also benefit from the techniques provided herein. The illustrated embodiments herein use the GAA structure. Semiconductor devices 101 and 103 represent a portion of an integrated circuit that may contain any number of similar semiconductor devices or gate cuts like first gate cut 120 and second gate cut 122.

As can be seen, semiconductor devices 101 and 103 are formed on a substrate 102. Any number of semiconductor devices can be formed on substrate 102, but two are used here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, a lower portion of (or all of) substrate 102 is removed and replaced with one or more backside interconnect layers to form backside signal and power routing.

Each of semiconductor devices 101 and 103 includes one or more nanoribbons 104 that extend parallel to one another along a direction between a source region and a drain region (e.g., a first direction into and out of the page in the cross-section view of FIG. 1A). Nanoribbons 104 are one example of semiconductor regions or semiconductor bodies that extend between source and drain regions. The term nanoribbon may also encompass other similar shapes such as nanowires or nanosheets. The semiconductor material of nanoribbons 104 may be formed from substrate 102. In some embodiments, semiconductor devices 101 and 103 may each include semiconductor regions in the shape of fins that can be, for example, native to substrate 102 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 104 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches.

As can further be seen, adjacent semiconductor devices are separated by a dielectric fill 106 that may include silicon oxide. Dielectric fill 106 provides shallow trench isolation (STI) between any adjacent semiconductor devices. Dielectric fill 106 can be any suitable dielectric material, such as silicon dioxide, aluminum oxide, or silicon oxycarbonitride.

Semiconductor devices 101 and 103 each include a subfin region 108. According to some embodiments, subfin region 108 comprises the same semiconductor material as substrate 102 and is adjacent to dielectric fill 106. According to some embodiments, nanoribbons 104 (or other semiconductor bodies) extend between a source and a drain region in the first direction to provide an active region for a transistor (e.g., the semiconductor region beneath the gate). The source and drain regions are not shown in the cross-section of FIG. 1A, but are seen in the top-down view of FIG. 1B where nanoribbons 104 of semiconductor device 101 extend between a source region 110*a* and a drain region 110*b* (similarly, the nanoribbons 104 of semiconductor device 103 extend between a source region 112*a* and a drain region 112*b*). FIG. 1B also illustrates spacer structures 114 that extend around the ends of nanoribbons 104 and along sidewalls of the gate structures between spacer structures 114. Spacer structures 114 may include a dielectric material, such as silicon nitride.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a first gate structure extends over nanoribbons 104 of semiconductor device 101 along a second direction across the page while a second gate structure extends over nanoribbons 104 of semiconductor device 103 along the second direction. Each gate structure includes a respective gate dielectric **116*a*/116*b* and a gate layer (or gate electrode) 118*a*/118*b*. Gate dielectric 116*a*/116*b* represents any number of dielectric layers present between nanoribbons 104 and gate electrode 118*a*/118*b*. Gate dielectric 116*a*/116*b* may also be present on the surfaces of other structures within the gate trench, such as on subfin region 108. Gate dielectric 116*a*/116*b* may include any suitable gate dielectric material(s). In some embodiments, gate dielectric 116*a*/116*b*** includes a layer of native oxide material (e.g., silicon oxide) on the nanoribbons or other semiconductor regions making up the channel region of the devices, and a layer of high-K dielectric material (e.g., hafnium oxide) on the native oxide.

Gate electrode **118*a*/118*b* may represent any number of conductive layers, such as any metal, metal alloy, or doped polysilicon layers. In some embodiments, gate electrode 118*a*/118*b* includes one or more workfunction metals around nanoribbons 104. In some embodiments, one of semiconductor devices 101 and 103 is a p-channel device that includes a workfunction metal having titanium around its nanoribbons 104 and the other semiconductor device is an n-channel device that includes a workfunction metal having tungsten around its nanoribbons 104. Gate electrode 118*a*/118*b*** may also include a fill metal or other conductive material around the workfunction metals to provide the whole gate electrode structure.

According to some embodiments, one or more gate cuts may be present adjacent to any of the semiconductor devices, such as a first gate cut 120 and a second gate cut 122. The gate cuts can act like dielectric barriers between different gate structures and extend along a third direction (e.g., vertically) through an entire thickness of the gate structures. Each of first gate cut 120 and second gate cut 122 may be formed from a sufficiently insulating material, such as a dielectric material. Example materials for the gate cuts include silicon nitride, silicon oxide, or silicon oxynitride. In some embodiments, one or both of first gate cut 120 or second gate cut 122 includes more than one dielectric material, such as a dielectric layer at its edges and a separate dielectric fill. The dielectric layer may include a high-k dielectric material and the dielectric fill may include a low-k dielectric material. First gate cut 120 may have a different dielectric material than second gate cut 122. Second gate cut 122 may be used not only to provide isolation between gate structures, but its larger width may be leveraged to provide electrical insulation for conductive vias that pass through it along the third direction. The conductive vias may be used to provide signal or power to backside structures.

According to some embodiments, first gate cut 120 has a width $w_1$ (or critical dimension) at its top surface (and substantially planar with a top surface of gate electrode **118*a*/118*b*) and second gate cut 122 has a width $w_2$ (or critical dimension) at its top surface (and substantially planar with a top surface of gate electrode 118*a*/118*b*). Width $w_2$ may be at least 1.5×, at least 2×, or at least 2.5 larger than width $w_1$. In some examples, width $w_1$ is between about 17 nm and about 20 nm and width $w_2$ is between about 25 nm and about 50 nm. According to some embodiments, first gate cut 120 and second gate cut 122 are formed at different times with different etching processes to control the etch depth such that the height $h_1$ of first gate cut 120 is similar to height $h_2$ of second gate cue 122. For example, height $h_1$ and height h 2** may differ by no more than a relatively small percentage, such as 10%, or 5%, or 2%. In some examples, each of height $h_1$ and height $h_2$ may be between about 125 nm and 200 nm, such as between 150 nm and about 180 nm, and height $h_1$ is within 10 nm of height $h_2$, or within 5 nm, or within 4 nm, or within 3 nm, or within 2 nm. In one specific such example case, each of height $h_1$ and height $h_2$ is within the range of 148 nm to 152 nm, or within 149 nm to 151 nm, and width $w_2$ is at least 1.5×, at least 2×, or at least 3× larger than width $w_1$.

First gate cut 120 and second gate cut 122 each extends in the first direction as seen in FIG. 1B such that they cut across at least the entire width of the gate trench. According to some embodiments, either or both first gate cut 120 or second gate cut 122 may also extend further past spacer structures 114 as indicated by the dashed, horizontal lines. In some examples, either or both first gate cut 120 or second gate cut 122 extends across more than one gate trench in the first direction (e.g., cutting through more than one gate structure running parallel along the second direction).

Fabrication Methodology

FIGS. 2A-2L include cross-sectional views that collectively illustrate an example process for forming an integrated circuit with semiconductor devices and gate cuts having different widths but substantially the same height, in accordance with an embodiment of the present disclosure. Each figure shows an example structure that results from the process flow up to that point in time, so the depicted structure evolves as the process flow continues, culminating in the structure shown in FIG. 2L. The illustrated integrated circuit structure may be part of a larger integrated circuit that includes other integrated circuitry not depicted. Example materials and process parameters are given, but the present disclosure is not intended to be limited to any specific such materials or parameters, as will be appreciated. Although the fabrication of two gate cuts are illustrated in the aforementioned figures, it should be understood that any number of similar gate cuts can be fabricated across the integrated circuit using the same processes discussed herein.

Figure 2A:
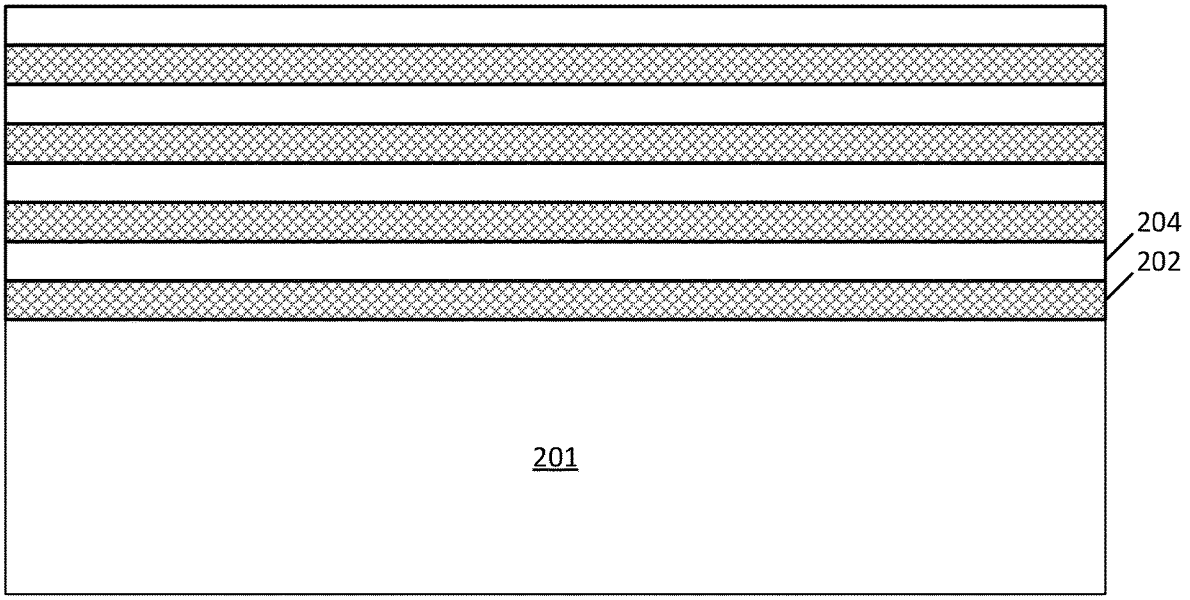
FIGS. 2A-2L are cross-sectional views that illustrate various stages in an example process for forming semiconductor devices that have gate cuts with different widths but similar heights, in accordance with some embodiments of the present disclosure.

FIG. 2A illustrates a cross-sectional view taken through a substrate 201 having a series of material layers formed over the substrate, according to an embodiment of the present disclosure. Alternating material layers may be deposited over substrate 201 including sacrificial layers 202 alternating with semiconductor layers 204. The alternating layers are used to form GAA transistor structures. Any number of alternating semiconductor layers 204 and sacrificial layers 202 may be deposited over substrate 201. The description above for substrate 102 applies equally to substrate 201.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD).

Figure 2B:
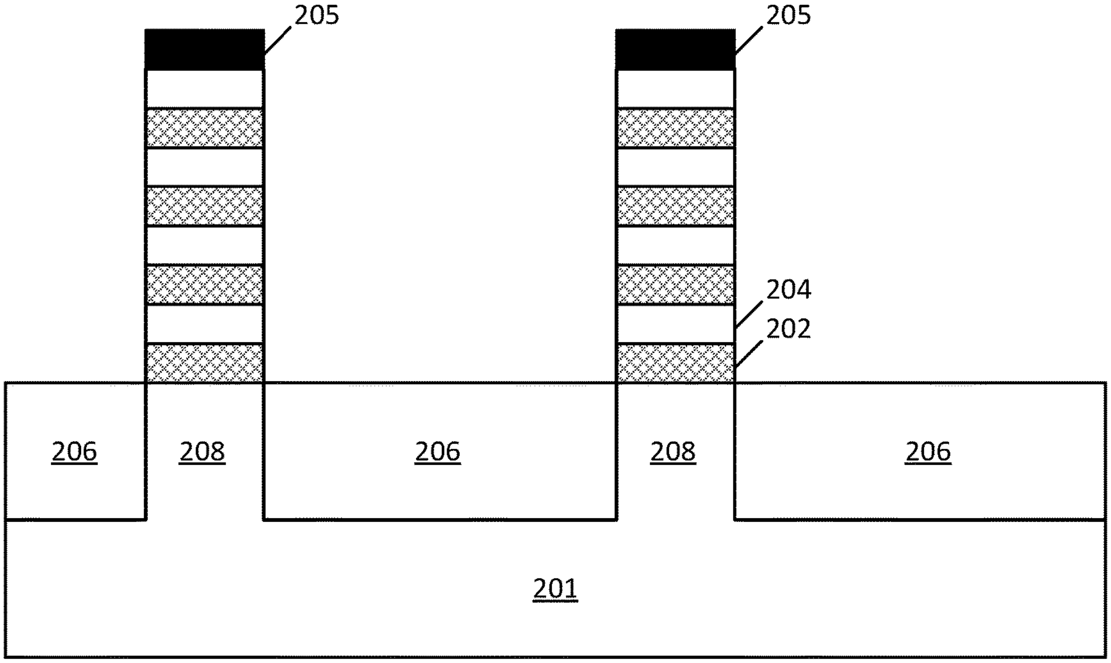

FIG. 2B depicts the cross-section view of the structure shown in FIG. 2A following the formation of a cap layer 205 and the subsequent formation of fins beneath cap layer 205, according to an embodiment. Cap layer 205 may be any suitable hard mask material such as a carbon hard mask (CHM) or silicon nitride. Cap layer 205 is patterned into rows to form corresponding rows of fins from the alternating layer stack of sacrificial layers 202 and semiconductor layers 204. The rows of fins extend lengthwise in a first direction (e.g., into and out of the page).

According to some embodiments, an anisotropic etching process through the layer stack continues into at least a portion of substrate 201. The etched portion of substrate 201 may be filled with a dielectric fill 206 that acts as shallow trench isolation (STI) between adjacent fins. Dielectric fill 206 may be any suitable dielectric material such as silicon oxide. Subfin regions 208 represent remaining portions of substrate 201 between dielectric fill 206, according to some embodiments.

Figure 2C:
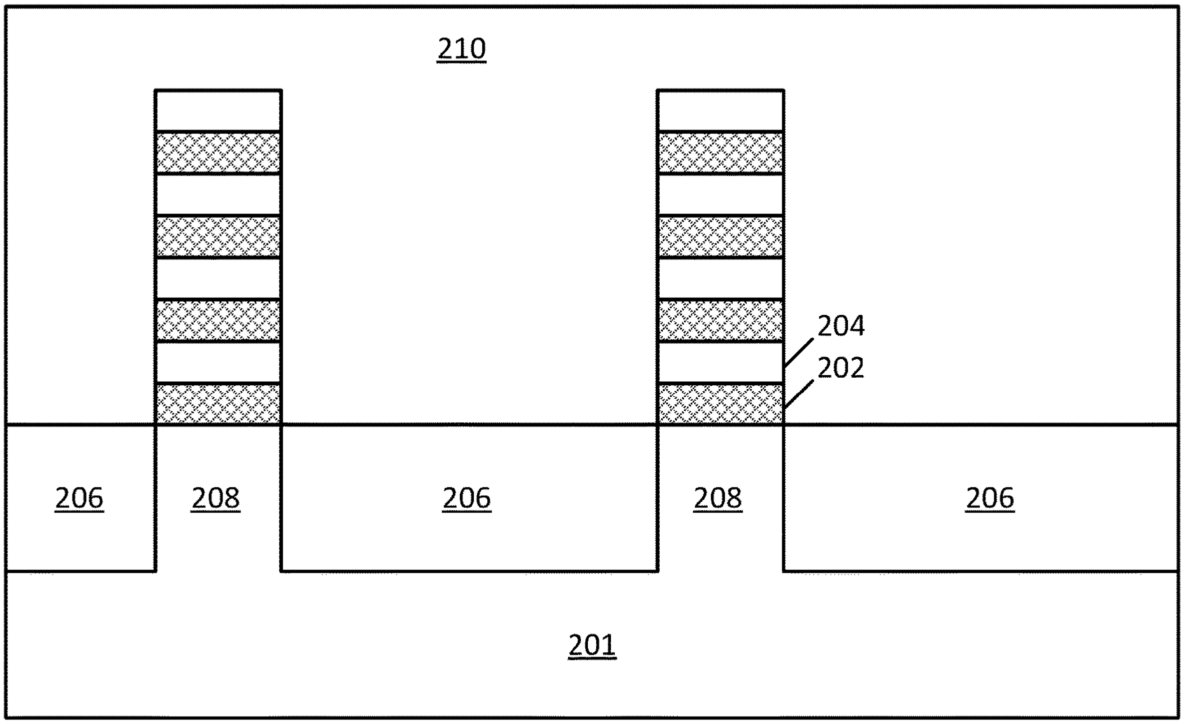

FIG. 2C depicts the cross-section view of the structure shown in FIG. 2B following the formation of a sacrificial gate 210 extending across the fins in a second direction different from the first direction, according to some embodiments. Sacrificial gate 210 may extend across the fins in a second direction that is orthogonal to the first direction. According to some embodiments, the sacrificial gate material is formed in parallel strips across the integrated circuit and removed in all areas not protected by a gate masking layer. Sacrificial gate 210 may be any suitable material that can be selectively removed without damaging the semiconductor material of the fins. In some examples, sacrificial gate 210 includes polysilicon.

Following the formation of sacrificial gate 210 (and prior to replacement of sacrificial gate 210 with a metal gate), additional semiconductor device structures are formed that are not shown in these cross-sections. These additional structures include spacer structures on the sidewalls of sacrificial gate 210 and source and drain regions on either ends of each of the fins. The formation of such structures would be well understood to a person skilled in the relevant art.

Figure 2D:
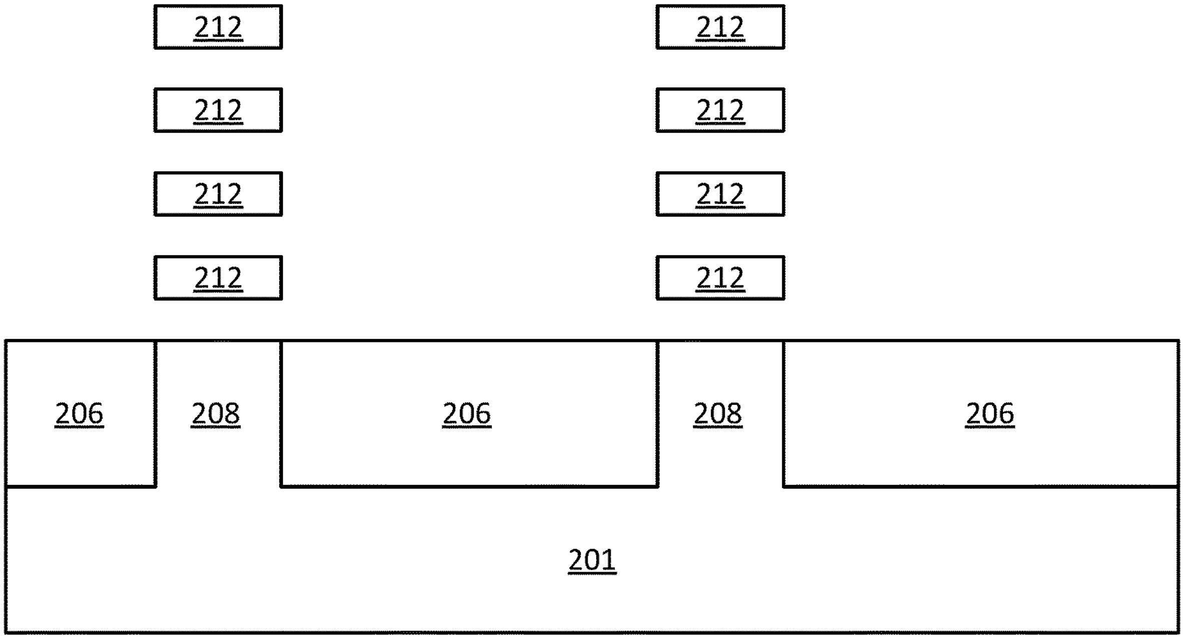

FIG. 2D depicts the cross-section view of the structure shown in FIG. 2C following the removal of sacrificial gate 210 and the removal of sacrificial layers 202, according to some embodiments. In examples where any gate masking layers are still present, they would also be removed at this time. Once sacrificial gate 210 is removed, the fins that had been beneath sacrificial gate 210 are exposed.

In the example where the fins include alternating semiconductor layers, sacrificial layers 202 are selectively removed to release nanoribbons 212 that extend between corresponding source or drain regions. Each vertical set of nanoribbons 212 represents the semiconductor region of a different semiconductor device. It should be understood that nanoribbons 212 may also be nanowires or nanosheets. Sacrificial gate 210 and sacrificial layers 202 may be removed using the same isotropic etching process or different isotropic etching processes.

Figure 2E:
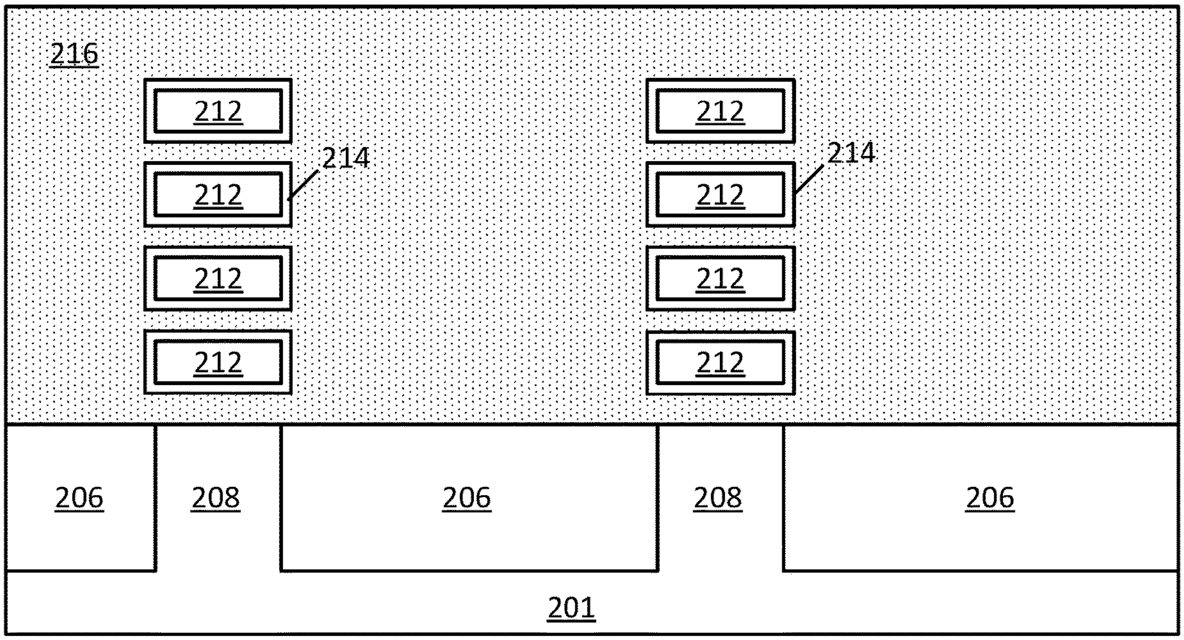

FIG. 2E depicts the cross-section view of the structure shown in FIG. 2D following the formation of a gate structure and subsequent polishing, according to some embodiments. The gate structure includes a gate dielectric 214 and a conductive gate electrode 216. Gate dielectric 214 may be first formed around nanoribbons 212 prior to the formation of gate electrode 216. The gate dielectric 214 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 214 includes a layer of hafnium oxide with a thickness between about 1 nm and about 5 nm. In some embodiments, gate dielectric 214 may include one or more silicates (e.g., titanium silicate, tungsten silicate, niobium silicate, and silicates of other transition metals). In some cases, gate dielectric 214 may include a first layer on nanoribbons 212, and a second layer on the first layer. The first layer can be, for instance, an oxide of the semiconductor material of nanoribbons 212 (e.g., silicon dioxide) and the second layer can be a high-k dielectric material (e.g., hafnium oxide). More generally, gate dielectric 214 can include any number of dielectric layers. According to some embodiments, gate dielectric 214 forms along all surfaces exposed within the gate trench, such as along inner sidewalls of the spacer structures and along the top surfaces of dielectric fill 206 and subfin regions 208.

As noted above, gate electrode 216 can represent any number of conductive layers. The conductive gate electrode 216 may be deposited using electroplating, electroless plating, CVD, PECVD, ALD, or PVD, to name a few examples. In some embodiments, gate electrode 216 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 216 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Following the formation of the gate structure, the entire structure may be polished such that the top surface of the gate structure (e.g., top surface of gate electrode 216) is planar with the top surface of other semiconductor elements, such as the spacer structures that define the gate trench.

Figure 2F:
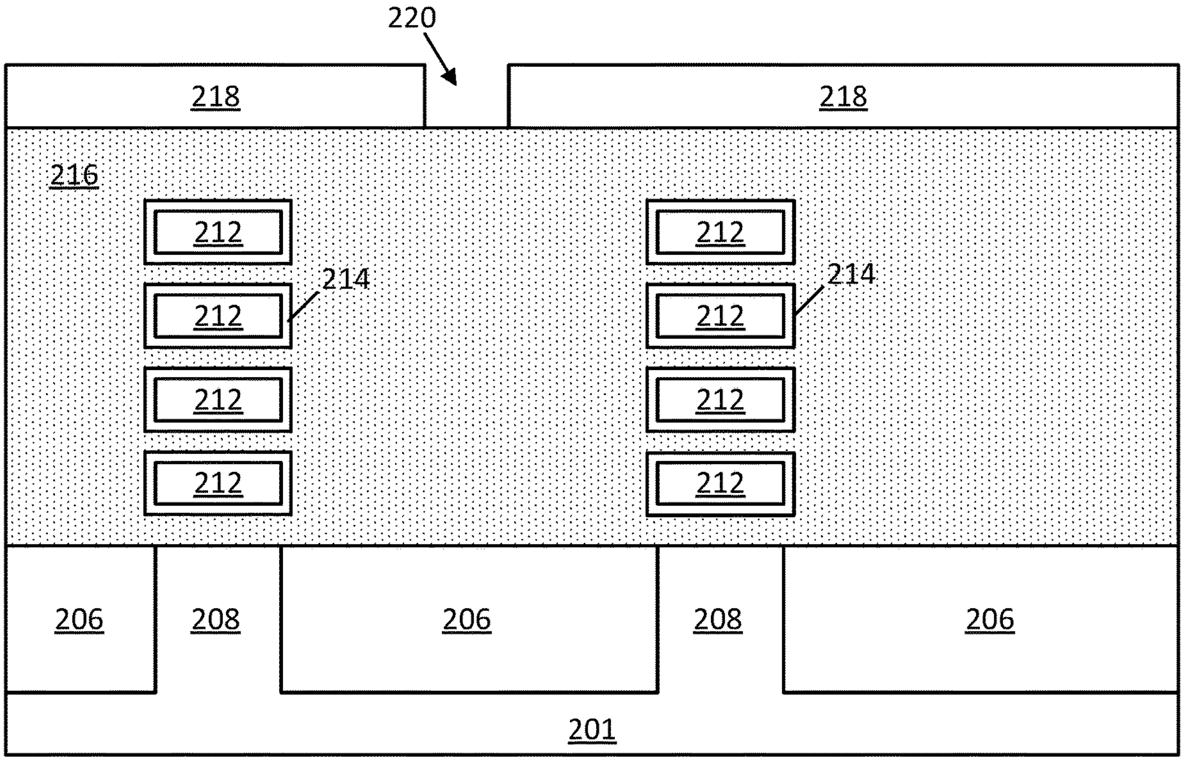

FIG. 2F illustrates another cross-section view of the structure shown in FIG. 2E following the formation of a masking structure 218, according to some embodiments. Masking structure 218 may include any number of hard mask layers, such as any dielectric layers or carbon hard mask layers. An opening 220 may be formed through masking structure 218 to expose a portion of gate electrode 216 where a gate cut will be formed. A reactive ion etching (RIE) process may be used to form opening 220. The size of opening 220 (e.g., width along the second direction) dictates the width at the top of the corresponding gate cut to be formed through the gate structure. Accordingly, any number of openings 220 having a similar width may be formed across the integrated circuit in order to form a corresponding number of first gate cuts all having a similar width.

Figure 2G:
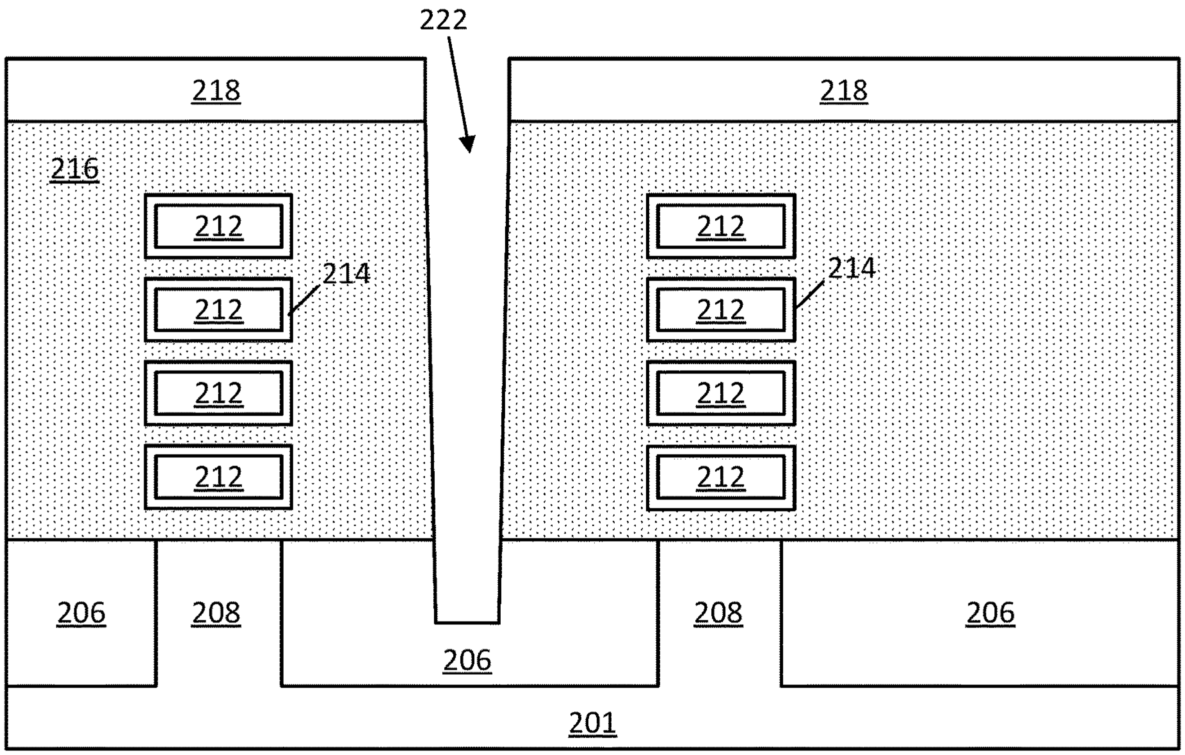

FIG. 2G illustrates another cross-section view of the structure shown in FIG. 2F following the formation of a gate cut recess 222 through a thickness of the gate structure, according to some embodiments. Gate cut recess 222 may be formed using a metal gate etch process that iteratively etches through portions of gate electrode 216 while simultaneously protecting the sidewalls of the recess from lateral etching to provide a high height-to-width aspect ratio (e.g., aspect ratio of 5:1 or higher, or 10:1 or higher). Gate cut recess 222 may extend into at least a portion of dielectric fill 206 or even deeper into a portion of the underlying substrate 201.

Figure 2H:
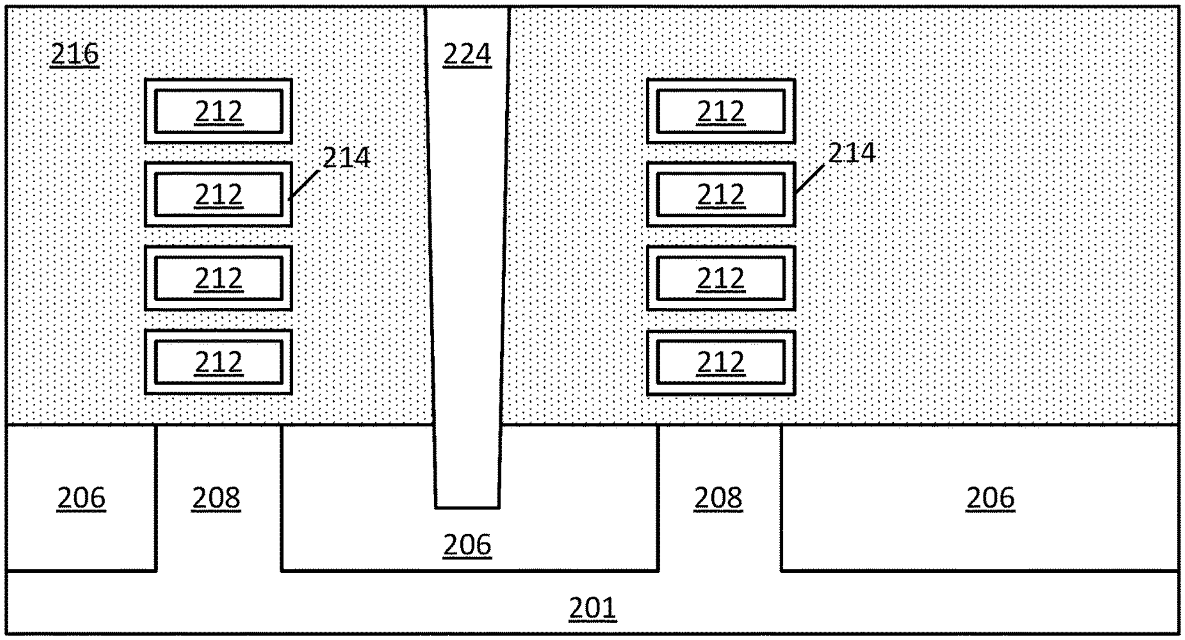

FIG. 2H illustrates another cross-section view of the structure shown in FIG. 2G following the formation of first gate cut 224 within gate cut recess 222 and the removal of masking structure 218 and any passivation layers used during the formation of gate cut recess 222, according to some embodiments. First gate cut 224 may be formed from one or more dielectric materials. For example, first gate cut 224 may include only silicon oxide or silicon nitride. In some examples, first gate cut 224 includes a first dielectric layer at the edges and a dielectric fill within a remaining volume. The first dielectric layer may include a high-k dielectric material (e.g. materials with a dielectric constant higher than that of silicon oxide or higher than 3.9) while the dielectric fill may include a low-k dielectric material (e.g. materials with a dielectric constant equal to or lower than that of silicon oxide or equal to or lower than 3.9).

Figure 2I:
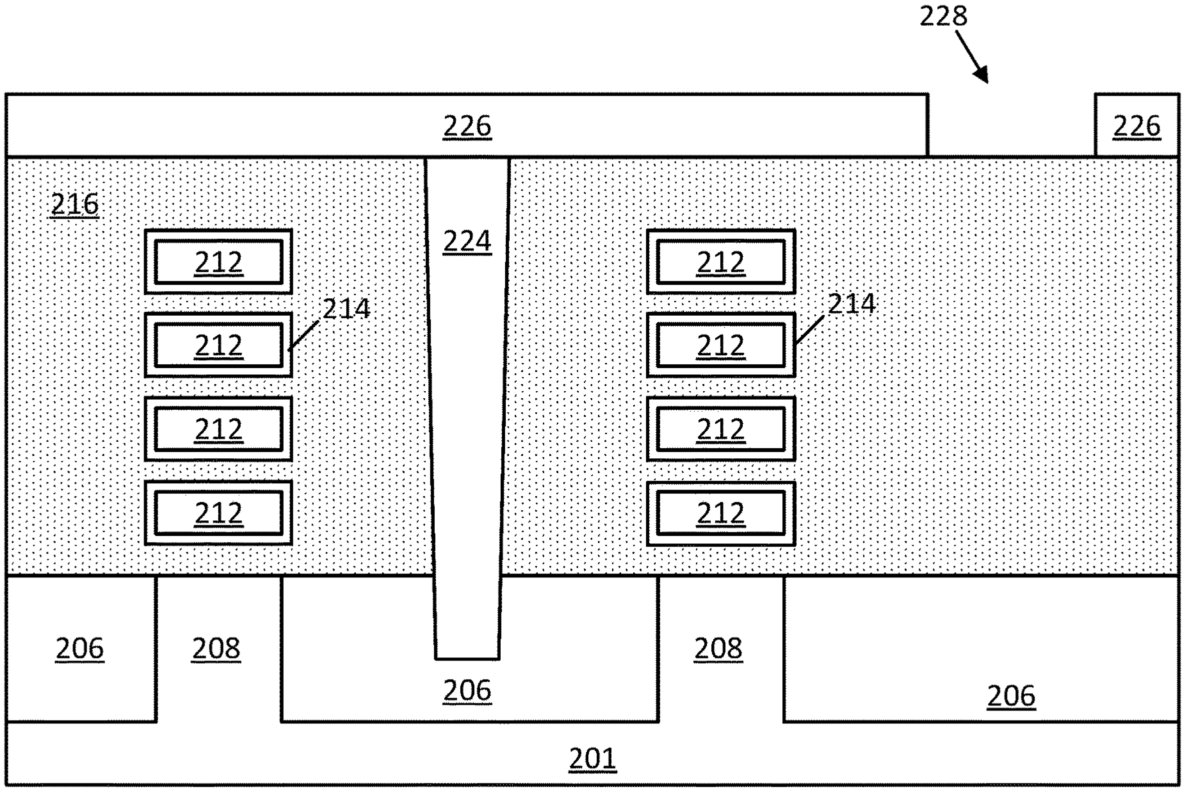

FIG. 2I illustrates another cross-section view of the structure shown in FIG. 2H following the formation of another masking structure 226, according to some embodiments. Masking structure 226 may include any number of hard mask layers, such as any dielectric layers or carbon hard mask layers. In some examples, masking structure 226 has the same composition as masking structure 218. An opening 228 may be formed through masking structure 226 to expose a portion of gate electrode 216 where another gate cut will be formed. A reactive ion etching (RIE) process may be used to form opening 228. The size of opening 228 (e.g., width along the second direction) dictates the width at the top of the corresponding gate cut to be formed through the gate structure. Accordingly, any number of openings 228 having a similar width may be formed across the integrated circuit in order to form a corresponding number of second gate cuts all having a similar width.

Figure 2J:
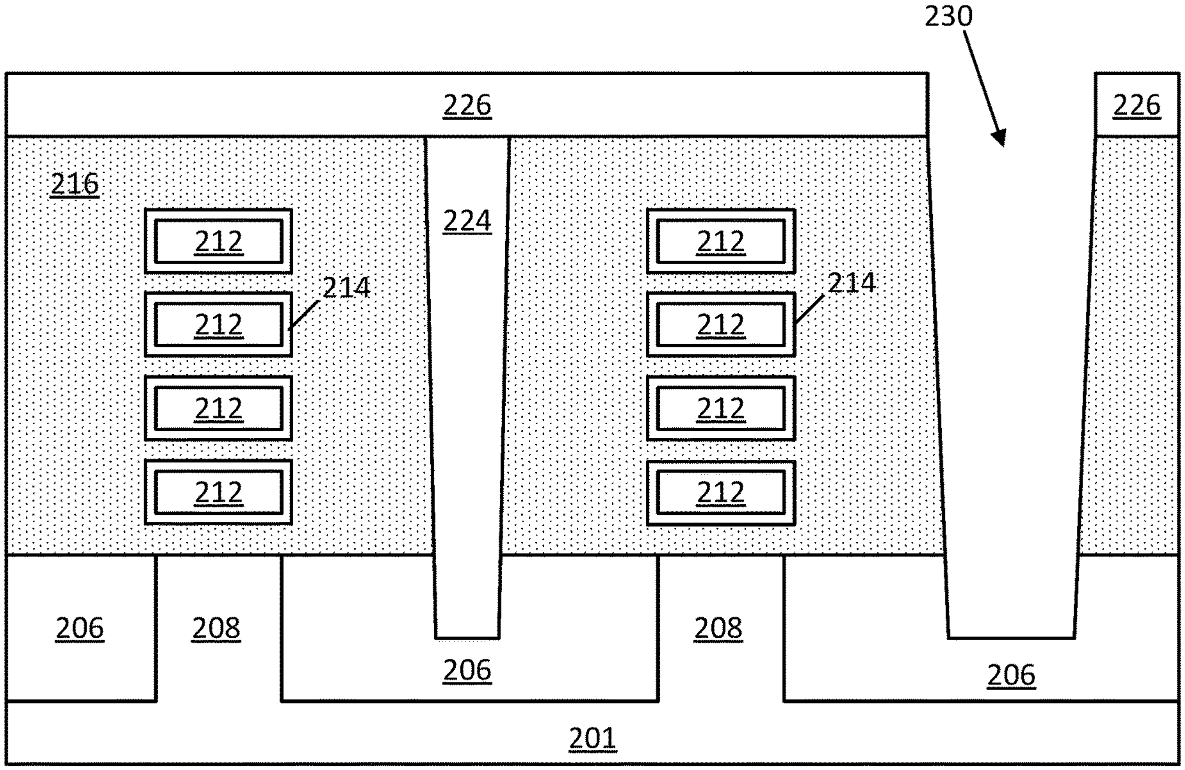

FIG. 2J illustrates another cross-section view of the structure shown in FIG. 2I following the formation of a gate cut recess 230 through a thickness of the gate structure, according to some embodiments. Gate cut recess 230 may be formed using any metal gate etch process, such as the process discussed above for forming gate cut recess 222 that iteratively etches through portions of gate electrode 216 while simultaneously protecting the sidewalls of the recess from lateral etching. Gate cut recess 230 may extend into at least a portion of dielectric fill 206 or even deeper into a portion of the underlying substrate 201.

As noted above, the overall time of the etching process (or number of etch cycles) used to form gate cut recess 230 may be tuned such that the final depth of gate cut recess 230 is substantially similar to the height of first gate cut 224 (e.g., within 5 nm or within 2 nm). Had both gate cut recess 222 and gate cut recess 230 been formed using the same etch process, gate cut recess 230 would extend far deeper (e.g., more than 20 nm) than gate cut recess 222 due to loading effects. Accordingly, gate cut recess 230 could extend into substrate 201 and the resulting gate cut could disrupt backside processing.

Figure 2K:
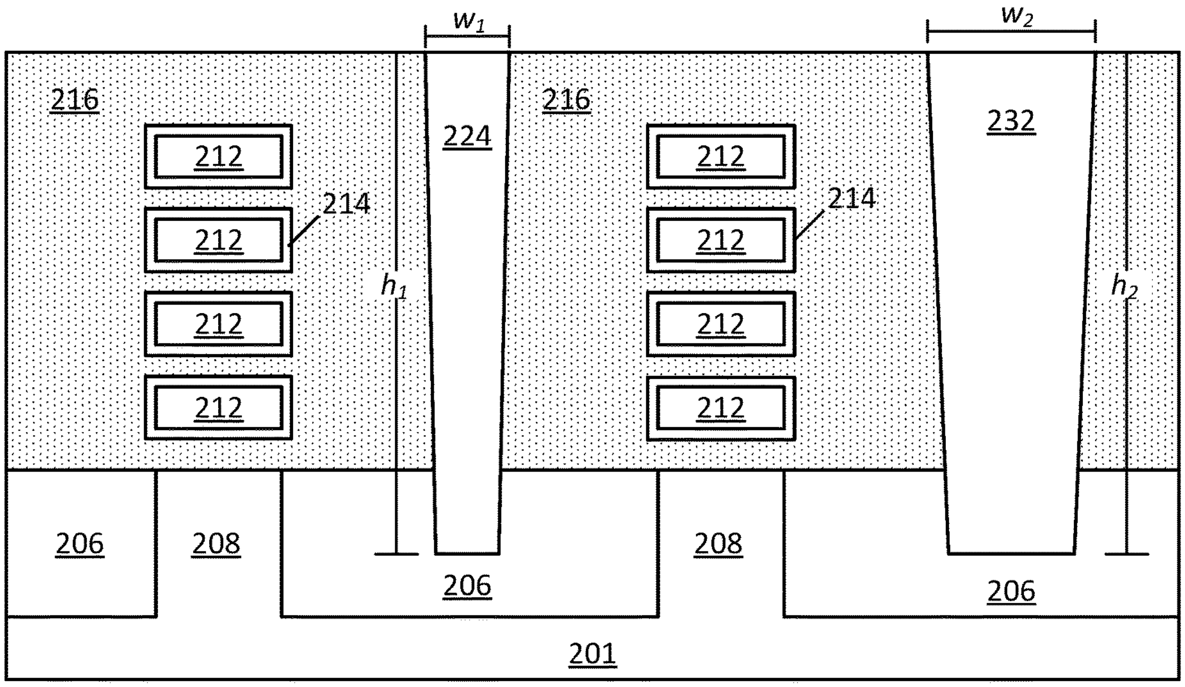
Figure 2K:
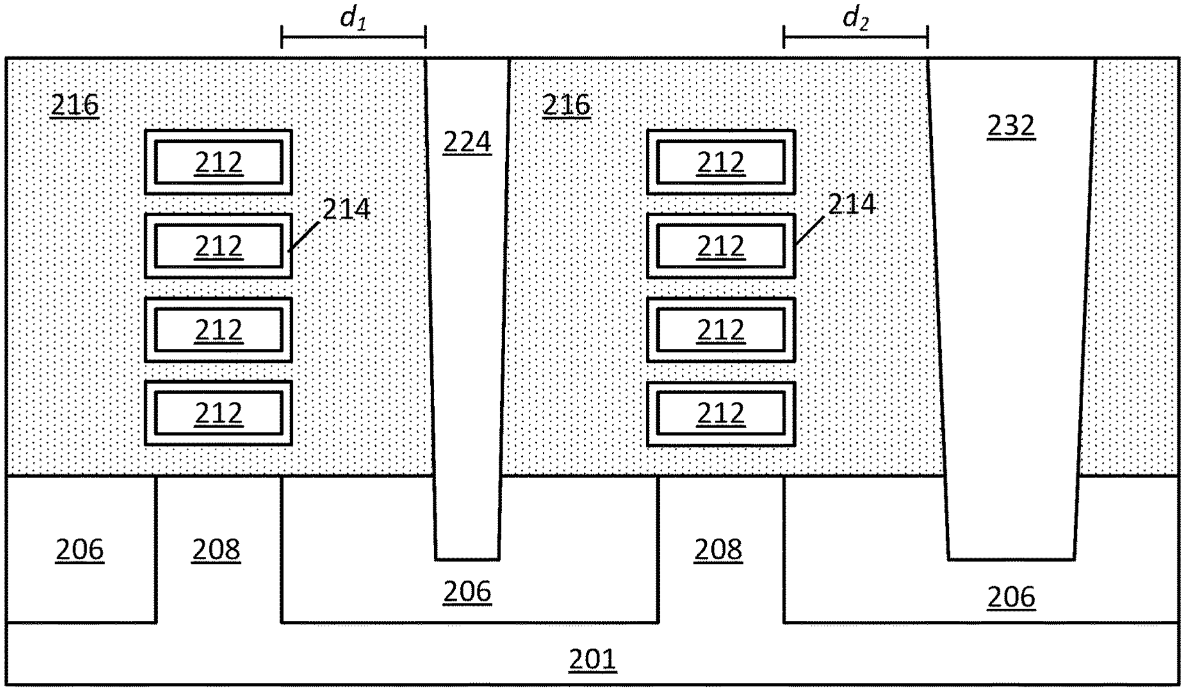

FIG. 2K illustrates another cross-section view of the structure shown in FIG. 2J following the formation of second gate cut 232 within gate cut recess 230 and the removal of masking structure 226 and any passivation layers used during the formation of gate cut recess 230, according to some embodiments. Second gate cut 232 may be formed from one or more dielectric materials. For example, second gate cut 232 may include only silicon oxide or silicon nitride. In some examples, second gate cut 232 includes a first dielectric layer at the edges and a dielectric fill within a remaining volume. The first dielectric layer may include a high-k dielectric material (e.g. materials with a dielectric constant higher than that of silicon oxide or higher than 3.9) while the dielectric fill may include a low-k dielectric material (e.g. materials with a dielectric constant equal to or lower than that of silicon oxide or equal to or lower than 3.9). In some embodiments, second gate cut 232 includes the same dielectric material or dielectric structure compared to first gate cut 224. In some other embodiments, second gate cut 232 includes a different dielectric material or dielectric structure compared to first gate cut 224.

According to some embodiments, first gate cut 224 has a width $w_1$ (or critical dimension) at its top surface (and substantially planar with a top surface of gate electrode 216) and second gate cut 132 has a width 1422 (or critical dimension) at its top surface (and substantially planar with a top surface of gate electrode 216). Width 1422 may be at least 1.5×, at least 2×, or at least 2.5 larger than width $w_1$. In some examples, width $w_1$ is between about 17 nm and about 20 nm and width 1422 is between about 25 nm and about 50 nm. According to some embodiments, first gate cut 224 has a height $h_1$ and second gate cut 232 has a height $h_2$ that is similar to height $h_1$. For example, height $h_1$ and height $h_2$ are both greater than 125 nm and may differ by no more than 20 nm, no more than 10 nm, no more than 5 nm, or no more than 2 nm. In one such example case, each of height $h_1$ and height $h_2$ may be between about 140 nm and about 180 nm, and may further be within 2 nm to 4 nm of each other.

Since first gate cut 224 and second gate cut 232 were formed at different times (and using different masking processes), there is likely to be some translation difference between the locations of the gate cuts with respect to adjacent semiconductor devices. As seen in FIG. 2K', first gate cut 224 may have a lateral distance $d_1$ between the top surface of first gate cut 224 and the edge of a closest side of an adjacent semiconductor device. Similarly, second gate cut 232 may have a lateral distance $d_2$ between the top surface of second gate cut 232 and the edge of a closest side of a corresponding adjacent semiconductor device. According to some embodiments, distance $d_1$ differs by at least 4 nm, by at least 5 nm, by at least 10 nm, or by at least 20 nm from distance dz.

According to some embodiments, a registration distance between first gate cut 224 and second gate cut 232 may be inconsistent across the integrated circuit (e.g., differ by at least 3 nm or at least 5 nm). This may occur due to the fact that two different masking processes are used to define the locations of first gate cut 224 and second gate cut 232 across the integrated circuit. If a single masking process was used to define the locations of both first gate cut 224 and second gate cut 232 at the same time, then the distance between the two gate cuts would be more consistent across the integrated circuit.

Figure 2L:
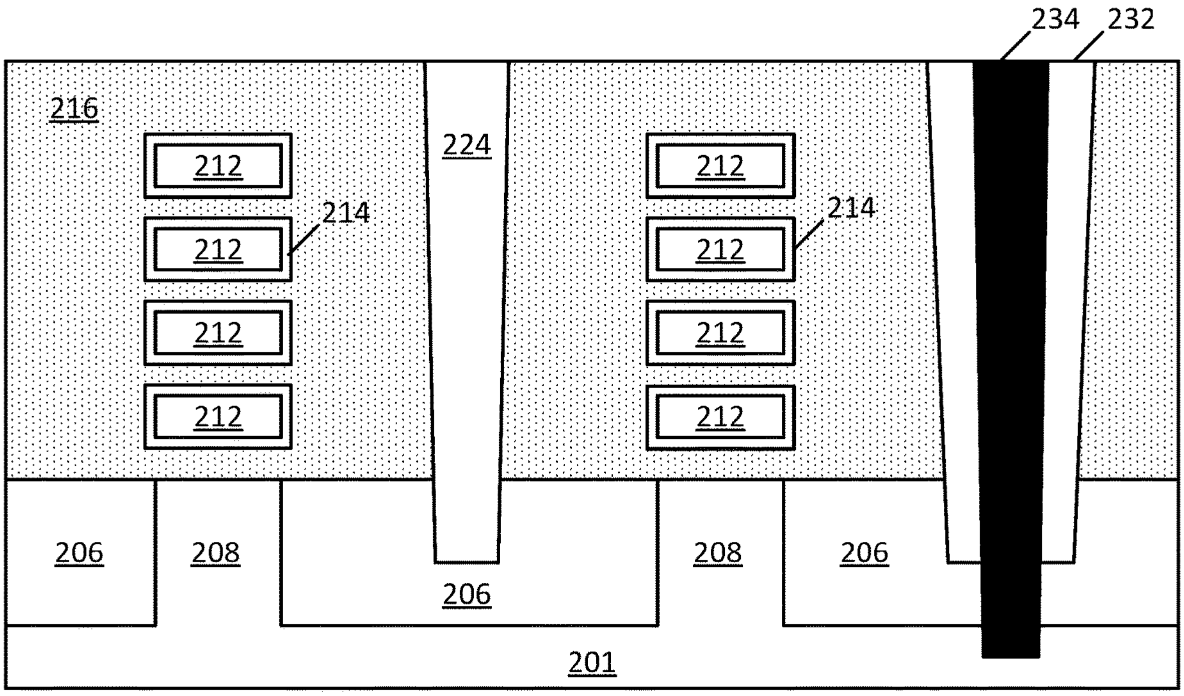

As noted above, the wider gate cuts may be used to provide insulation for conductive vias that pass through them. FIG. 2L illustrates another cross-section view of the structure shown in FIG. 2K following the formation of a via 234 that passes through second gate cut 232, according to some embodiments. Via 234 may be formed from any suitable conductive material, such as tungsten, titanium, ruthenium, molybdenum, tantalum, aluminum, or any alloys thereof. In some embodiments, via 234 extends through the entire height of second gate cut 232 and into at least a portion of the underlying substrate 102. Via 234 may be used to provide electrical connection to backside structures formed after removal of a bulk portion of substrate 201 (e.g., portion of substrate 201 below dielectric fill 206).

Figure 3:
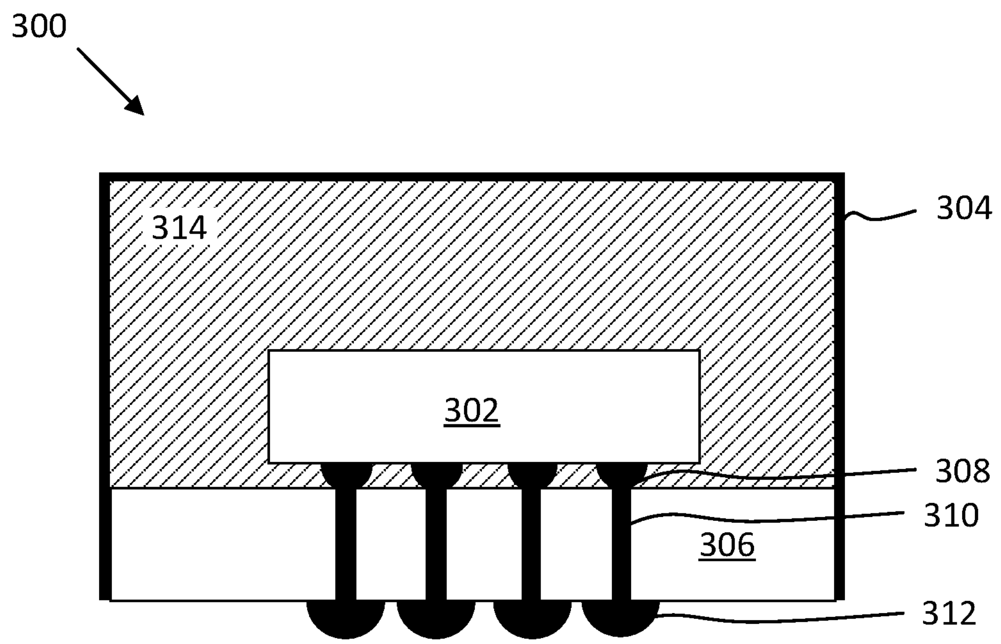
FIG. 3 illustrates a cross-sectional view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
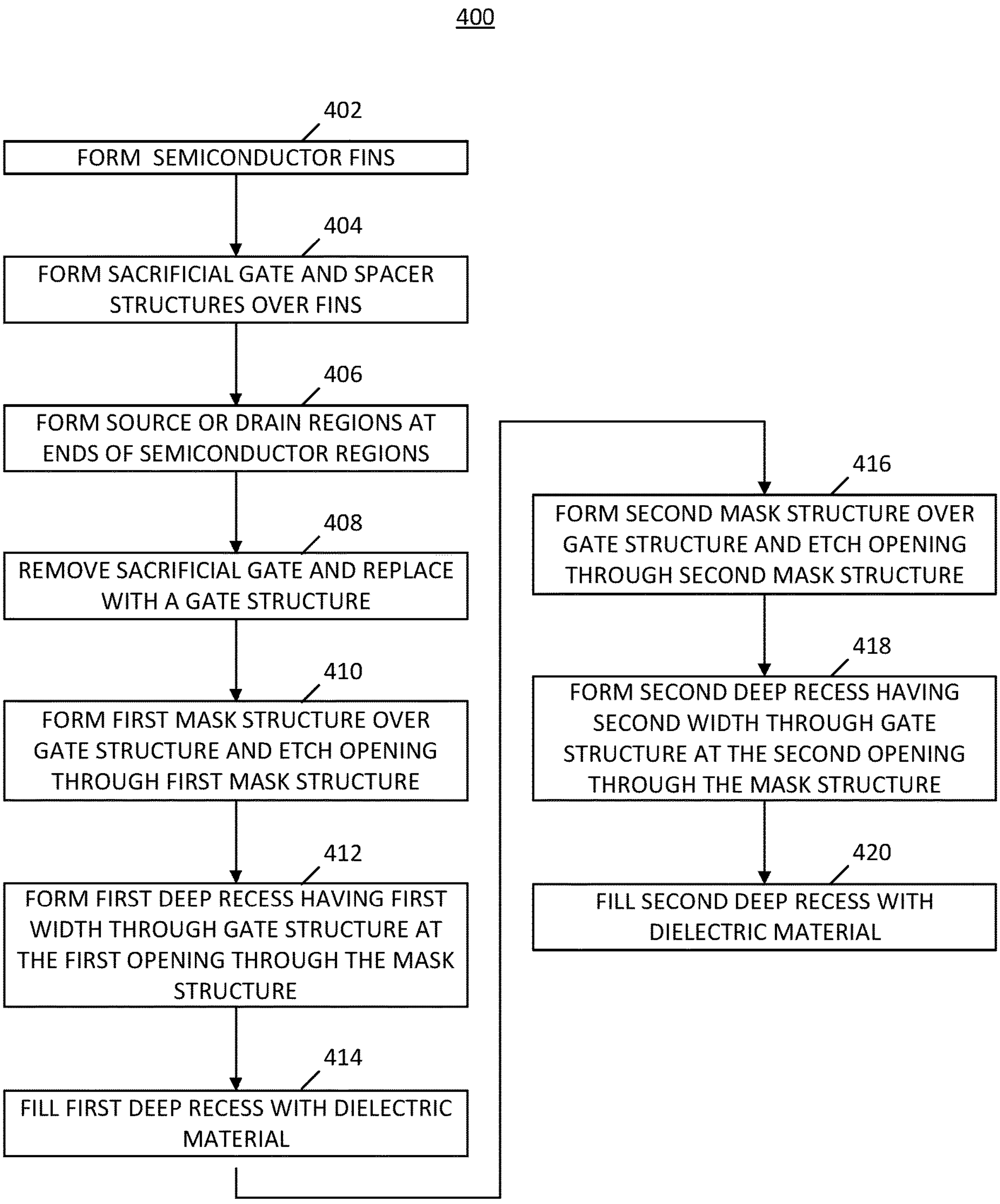
FIG. 4 is a flowchart of a fabrication process for semiconductor devices having gate cuts with different widths but similar heights, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2K. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. For example, method 400 does not explicitly describe all processes that are performed to form common transistor structures. Some of the operations of method 400 may be performed in a different order than the illustrated order.

Method 400 begins with operation 402 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric fill is formed around subfin portions of the one or more fins. In some embodiments, the dielectric fill extends between each pair of adjacent parallel fins and runs lengthwise in the same direction as the fins. In some embodiments, the anisotropic etching process that forms the fins also etches into a portion of the substrate and the dielectric fill may be formed within the recessed portions of the substrate. Accordingly, the dielectric fill acts as shallow trench isolation (STI) between adjacent fins. The dielectric fill may be any suitable dielectric material, such as silicon oxide.

Method 400 continues with operation 404 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures. According to some embodiments, the spacer structures may be any suitable dielectric material, such as silicon nitride or silicon oxynitride.

Method 400 continues with operation 406 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions.

Method 400 continues with operation 408 where the sacrificial gate is removed and replaced with a gate structure. The sacrificial gate may be removed using an isotropic etching process that selectively removes all of the material from the sacrificial gate, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structure may include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples.

Method 400 continues with operation 410 where a first mask structure is formed over the gate structure and an opening is formed through the first mask structure to expose a portion of the underlying gate electrode. According to some embodiments, the opening through the first mask structure is at a location where a first gate cut is to be formed through the underlying gate electrode. The first mask structure may include any number of hard mask layers, such as any dielectric layers or carbon hard mask layers. The opening may be formed using a directional RIE process.

Method 400 continues with operation 412 where a first deep recess is formed through the gate structure beneath the opening through the first mask structure. According to some embodiments, the first deep recess has a high height-to-width aspect ratio of at least 5:1 or at least 10:1, or higher, and extends through at least an entire thickness of the gate electrode. In some examples, the first deep recess extends into the dielectric fill between devices.

Method 400 continues with operation 414 where the first deep recess is filled with a dielectric material to form a first gate cut through the gate structure. The first gate cut may be formed from one or more dielectric materials. For example, the first gate cut may include only silicon oxide or silicon nitride. In some examples, the first gate cut includes a first dielectric layer at the edges and a dielectric fill within a remaining volume. The first dielectric layer may include a high-k dielectric material (e.g. materials with a dielectric constant higher than that of silicon oxide) while the dielectric fill may include a low-k dielectric material (e.g. materials with a dielectric constant equal to or lower than that of silicon oxide). In an example, the first gate cut may have a width at a top surface of the first gate cut between about 17 nm and about 20 nm and a height between about 140 nm and about 180 nm.

Method 400 continues with operation 416 where a second mask structure is formed over the gate structure and an opening is formed through the second mask structure to expose a portion of the underlying gate electrode. According to some embodiments, the opening through the second mask structure is at a location where a second gate cut is to be formed through the underlying gate electrode. The second mask structure may include any number of hard mask layers, such as any dielectric layers or carbon hard mask layers. The opening may be formed using a directional RIE process.

Method 400 continues with operation 418 where a second deep recess is formed through the gate structure beneath the opening through the second mask structure. According to some embodiments, the second deep recess has a lower height-to-width aspect ratio compared to the first deep recess due to having a wider width at the top of the second deep recess. According to some embodiments, the second deep recess extends through at least an entire thickness of the gate electrode to a depth that is substantially similar to the depth of the first deep recess. In some examples, the second deep recess has a height that is within 10 nm, within 5 nm, or within 2 nm of a height of the first deep recess. In some examples, the second deep recess has a largest width (e.g., at its top surface) that is at least 1.5×, 2×, or 2.5× greater than the largest width (e.g., at its top surface) of the first deep recess.

Method 400 continues with operation 420 where the second deep recess is filled with a dielectric material to form a second gate cut through the gate structure. The second gate cut may be formed from one or more dielectric materials. For example, the second gate cut may include only silicon oxide or silicon nitride. In some examples, the second gate cut includes a first dielectric layer at the edges and a dielectric fill within a remaining volume. The first dielectric layer may include a high-k dielectric material (e.g. materials with a dielectric constant higher than that of silicon oxide) while the dielectric fill may include a low-k dielectric material (e.g. materials with a dielectric constant equal to or lower than that of silicon oxide). In some embodiments, the second gate cut includes the same dielectric material or dielectric structure compared to the first gate cut. In some other embodiments, the second gate cut includes a different dielectric material or dielectric structure compared to the first gate cut.

It should be understood that gate cuts having two different widths (or CDs) have been described herein, but that any number of different gate cut widths can be included in the integrated circuit, with a separate etching process being performed for gate cuts of similar width. For example, after formation of the second gate cut, a third masking structure can be formed and third one or more gate cuts having widths different from the first one or more gate cuts and second one or more gate cuts can be formed using a different etching process. Also, the gate cuts may be formed in any order, such that the wider gate cuts can be formed before narrower gate cuts. In general, a given group of gate cuts having a similar first width can be formed either before or after any other group of gate cuts having a similar second width.

Example System

Figure 5:
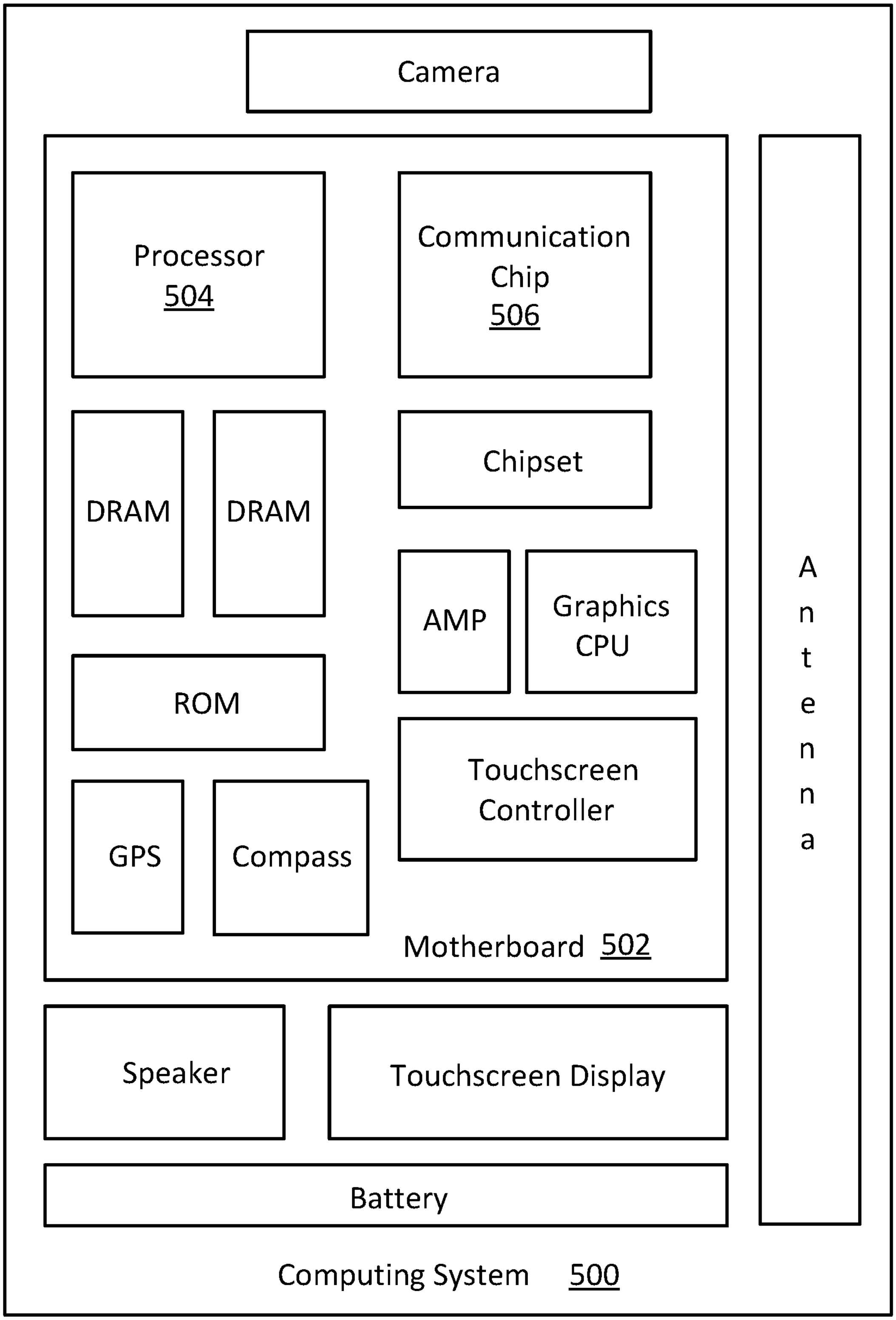
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment, such as a module including an integrated circuit on a substrate, the substrate having semiconductor devices and gate cuts having different widths but substantially the same height (e.g., heights within 10 nm, 5 nm, or 2 nm of each other). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes one or more semiconductor regions extending in a first direction between corresponding source regions and drain regions, a gate structure extending in a second direction over the one or more semiconductor regions, a first gate cut comprising a first dielectric material and extending in a third direction through an entire thickness of the gate structure, and a second gate cut comprising a second dielectric material and extending in the third direction through the entire thickness of the gate structure. A width at a top of the second gate cut is at least twice as large as a width at a top of the first gate cut. The first gate cut and the second gate cut each has a height in the third direction that differs by no more than 10 nm.

Example 2 includes the integrated circuit of Example 1, wherein the first gate cut or the second gate cut comprises a dielectric layer along one or more edges of the first gate cut or the second gate cut and a dielectric fill in a remaining volume of the first gate cut or the second gate cut.

Example 3 includes the integrated circuit of Example 1 or 2, wherein the one or more semiconductor regions comprises a plurality of semiconductor nanoribbons.

Example 4 includes the integrated circuit of Example 3, wherein the plurality of semiconductor nanoribbons comprise germanium, silicon, or any combination thereof.

Example 5 includes the integrated circuit of any one of Examples 1-4, wherein the gate structure includes a gate dielectric around the one or more semiconductor regions.

Example 6 includes the integrated circuit of Example 5, wherein the gate dielectric is not present on any sidewall of the first gate cut and not present on any sidewall of the second gate cut.

Example 7 includes the integrated circuit of any one of Examples 1-6, wherein the first gate cut and the second gate cut each has a height in the third direction that differs by no more than 4 nm.

Example 8 includes the integrated circuit of any one of Examples 1-7, further comprising subfin regions beneath each of the one or more semiconductor regions and a dielectric fill between adjacent subfin regions, wherein the first gate cut and the second gate cut each extend into the dielectric fill.

Example 9 includes the integrated circuit of any one of Examples 1-8, further comprising a conductive via that extends in the third direction through a height of the second gate cut.

Example 10 includes the integrated circuit of any one of Examples 1-9, wherein the first dielectric material has a different material composition than the second dielectric material.

Example 11 is a printed circuit board comprising the integrated circuit of any one of Examples 1-10.

Example 12 is an electronic device that includes a chip package comprising one or more dies. At least one of the one or more dies includes one or more semiconductor regions extending in a first direction between corresponding source regions and drain regions, a gate structure extending in a second direction over the one or more semiconductor regions, a first gate cut comprising a first dielectric material and extending in a third direction through an entire thickness of the gate structure, and a second gate cut comprising a second dielectric material and extending in the third direction through the entire thickness of the gate structure. A width at a top of the second gate cut is at least 1.5× as large as a width at a top of the first gate cut. The first gate cut and the second gate cut each has a height in the third direction that differs by no more than 5 nm.

Example 13 includes the electronic device of Example 12, wherein the first gate cut or the second gate cut comprises a dielectric layer along one or more edges of the first gate cut or the second gate cut and a dielectric fill in a remaining volume of the first gate cut or the second gate cut.

Example 14 includes the electronic device of Example 12 or 13, wherein the one or more semiconductor regions comprises a plurality of semiconductor nanoribbons.

Example 15 includes the electronic device of Example 14, wherein the plurality of semiconductor nanoribbons comprise germanium, silicon, or any combination thereof.

Example 16 includes the electronic device of any one of Examples 12-15, wherein the gate structure includes a gate dielectric around the one or more semiconductor regions.

Example 17 includes the electronic device of Example 16, wherein the gate dielectric is not present on any sidewall of the first gate cut and not present on any sidewall of the second gate cut.

Example 18 includes the electronic device of any one of Examples 12-17, wherein the first gate cut and the second gate cut each has a height in the third direction that differs by no more than 2 nm.

Example 19 includes the electronic device of any one of Examples 12-18, wherein the at least one of the one or more dies further comprises subfin regions beneath each of the one or more semiconductor regions and a dielectric fill between adjacent subfin regions, wherein the first gate cut and the second gate cut each extend into the dielectric fill.

Example 20 includes the electronic device of any one of Examples 12-19, wherein the at least one of the one or more dies further comprises a conductive via that extends in the third direction through a height of the second gate cut.

Example 21 includes the electronic device of any one of Examples 12-20, wherein the first dielectric material has a different material composition than the second dielectric material.

Example 22 includes the electronic device of any one of Examples 12-21, further comprising a printed circuit board, wherein the chip package is coupled to the printed circuit board.

Example 23 is a method of forming an integrated circuit. The method includes forming one or more fins comprising semiconductor material, the one or more fins extending above a substrate and the semiconductor material extending in a first direction; forming a gate layer extending over the semiconductor material in a second direction different from the first direction; exposing a first plurality of gate layer regions using a first masking layer; forming a first plurality of gate cuts at the first plurality of gate layer regions, the first plurality of gate cuts extending in a third direction through an entire thickness of the gate layer; exposing a second plurality of gate layer regions using a second masking layer; and forming a second plurality of gate cuts at the second plurality of gate layer regions. The second plurality of gate cuts extend in the third direction through the entire thickness of the gate layer. The second plurality of gate cuts have a topside width that is at least twice as large as a topside width of the first plurality of gate cuts.

Example 24 includes the method of Example 23, wherein the one or more fins include subfin regions and the method further comprises forming a dielectric fill between adjacent subfin regions.

Example 25 includes the method of Example 24, wherein forming the first plurality of gate cuts comprises etching a first plurality of trenches through an entire thickness of the gate layer at the first plurality of gate layer regions; and filling the first plurality of trenches with a first dielectric material.

Example 26 includes the method of Example 25, wherein forming the second plurality of gate cuts comprises etching a second plurality of trenches through an entire thickness of the gate layer at the second plurality of gate layer regions; and filling the second plurality of trenches with a second dielectric material.

Example 27 includes the method of Example 26, wherein the first dielectric material has a different material composition than the second dielectric material.

Example 28 is an integrated circuit that includes a first semiconductor region extending in a first direction between corresponding source and drain regions, a second semiconductor region extending in the first direction between corresponding source and drain regions, a gate structure extending in a second direction over at least the first semiconductor region and the second semiconductor region, a first gate cut comprising a first dielectric material and extending in a third direction through an entire thickness of the gate structure, and a second gate cut comprising a second dielectric material and extending in the third direction through the entire thickness of the gate structure. The first gate cut is adjacent to a first side of the first semiconductor region and is spaced in the second direction from the first side of the first semiconductor region by a first distance, and the second gate cut is adjacent to the corresponding first side of the second semiconductor region and is spaced in the second direction from the corresponding first side of the second semiconductor region by a second distance. The second distance differs by at least 4 nm from the first distance.

Example 29 includes the integrated circuit of Example 28, wherein the first gate cut or the second gate cut comprises a dielectric layer along one or more edges of the first gate cut or the second gate cut and a dielectric fill in a remaining volume of the first gate cut or the second gate cut.

Example 30 includes the integrated circuit of Example 28 or 29, wherein the first and second semiconductor regions comprises a plurality of semiconductor nanoribbons.

Example 31 includes the integrated circuit of Example 30, wherein the plurality of semiconductor nanoribbons comprise germanium, silicon, or any combination thereof.

Example 32 includes the integrated circuit of any one of Examples 28-31, wherein the gate structure includes a gate dielectric around the first and second semiconductor regions.

Example 33 includes the integrated circuit of Example 32, wherein the gate dielectric is not present on any sidewall of the first gate cut and not present on any sidewall of the second gate cut.

Example 34 includes the integrated circuit of any one of Examples 28-33, wherein the first gate cut and the second gate cut each has a height in the third direction, and their respective heights differ by no more than 4 nm.

Example 35 includes the integrated circuit of any one of Examples 28-34, wherein a width at a top of the second gate cut is at least twice as large as a width at a top of the first gate cut.

Example 36 includes the integrated circuit of any one of Examples 28-35, wherein the first gate cut and the second gate cut each has a height-to-width aspect ratio of 5:1 or higher.

Example 37 includes the integrated circuit of any one of Examples 28-36, further comprising a conductive via that extends in the third direction through a height of the second gate cut.

Example 38 is a printed circuit board comprising the integrated circuit of any one of Examples 28-37.

Example 39 is the integrated circuit, printed circuit board, electronic device, or method of any one of Examples 1-38, wherein the first gate cut and the second gate cut each has a height-to-width aspect ratio of 8:1 or higher, and a height in the range of 125 nm to 180 nm.

Example 40 is the integrated circuit, printed circuit board, electronic device, or method of Example 39, wherein a width at a top of the second gate cut is at least 2× as large as a width at a top of the first gate cut, and wherein the first gate cut and the second gate cut each has a height in the third direction, and their respective heights differ by no more than 4 nm.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

one or more semiconductor regions above a dielectric fill and extending in a first direction between corresponding source regions and drain regions;

a gate structure extending in a second direction over the one or more semiconductor regions;

a first gate cut comprising a first dielectric material and extending in a third direction through an entire thickness of the gate structure, the first gate cut extending only partially into the dielectric fill; and a second gate cut comprising a second dielectric material and extending in the third direction through the entire thickness of the gate structure, the second gate cut extending only partially into the dielectric fill, wherein a width at a top of the second gate cut is at least twice as large as a width at a top of the first gate cut, and wherein the first gate cut and the second gate cut each has a height in the third direction that differs by no more than 10 nm.

2. The integrated circuit of claim 1, wherein the gate structure includes a gate dielectric around the one or more semiconductor regions.

3. The integrated circuit of claim 2, wherein the gate dielectric is not present on any sidewall of the first gate cut and not present on any sidewall of the second gate cut.

4. The integrated circuit of claim 1, wherein the first gate cut and the second gate cut each has a height in the third direction that differs by no more than 4 nm.

5. The integrated circuit of claim 1, further comprising subfin regions beneath each of the one or more semiconductor regions and the dielectric fill between adjacent subfin regions.

6. The integrated circuit of claim 1, further comprising a conductive via that extends in the third direction through a height of the second gate cut.

7. The integrated circuit of claim 1, wherein the first dielectric material has a different material composition than the second dielectric material.

8. A printed circuit board comprising the integrated circuit of claim 1.

9. An electronic device, comprising:

a chip package comprising one or more dies, at least one of the one or more dies comprising one or more semiconductor regions above a dielectric fill and extending in a first direction between corresponding source regions and drain regions;

a gate structure extending in a second direction over the one or more semiconductor regions;

a first gate cut comprising a first dielectric material and extending in a third direction through an entire thickness of the gate structure, the first gate cut extending only partially into the dielectric fill; and a second gate cut comprising a second dielectric material and extending in the third direction through the entire thickness of the gate structure, the second gate cut extending only partially into the dielectric fill, wherein a width at a top of the second gate cut is at least 1.5× as large as a width at a top of the first gate cut, and wherein the first gate cut and the second gate cut each has a height in the third direction that differs by no more than 5 nm.

10. The electronic device of claim 9, wherein the gate structure includes a gate dielectric around the one or more semiconductor regions and the gate dielectric is not present on any sidewall of the first gate cut and not present on any sidewall of the second gate cut.

11. The electronic device of claim 9, wherein the first gate cut and the second gate cut each has a height in the third direction that differs by no more than 2 nm.

12. The electronic device of claim 9, wherein the at least one of the one or more dies further comprises a conductive via that extends in the third direction through a height of the second gate cut.

13. The electronic device of claim 9, wherein the first dielectric material has a different material composition than the second dielectric material.

14. The electronic device of claim 9, further comprising a printed circuit board, wherein the chip package is coupled to the printed circuit board.

15. An integrated circuit comprising:

a first semiconductor region above a dielectric fill and extending in a first direction between corresponding source and drain regions;

a second semiconductor region above the dielectric fill and extending in the first direction between corresponding source and drain regions;

a gate structure extending in a second direction over at least the first semiconductor region and the second semiconductor region;

a first gate cut comprising a first dielectric material and extending in a third direction through an entire thickness of the gate structure, the first gate cut extending only partially into the dielectric fill; and a second gate cut comprising a second dielectric material and extending in the third direction through the entire thickness of the gate structure, the second gate cut extending only partially into the dielectric fill, wherein the first gate cut is adjacent to a first side of the first semiconductor region and is spaced in the second direction from the first side of the first semiconductor region by a first distance, and the second gate cut is adjacent to the corresponding first side of the second semiconductor region and is spaced in the second direction from the corresponding first side of the second semiconductor region by a second distance, the second distance differing by at least 4 nm from the first distance.

16. The integrated circuit of claim 15, wherein the gate structure includes a gate dielectric around the first and second semiconductor regions and the gate dielectric is not present on any sidewall of the first gate cut and not present on any sidewall of the second gate cut.

17. The integrated circuit of claim 15, wherein the first gate cut and the second gate cut each has a height in the third direction, and their respective heights differ by no more than 4 nm.

18. The integrated circuit of claim 15, wherein a width at a top of the second gate cut is at least twice as large as a width at a top of the first gate cut.

19. The integrated circuit of claim 15, wherein the first gate cut and the second gate cut each has a height-to-width aspect ratio of 5:1 or higher.

20. The integrated circuit of claim 15, further comprising a conductive via that extends in the third direction through a height of the second gate cut.

* * * * *